(12) United States Patent
Matsuoka

(10) Patent No.: US 11,502,278 B2
(45) Date of Patent: Nov. 15, 2022

(54) DISPLAY DEVICE INCLUDING TRANSPARENT PARTITION WALL AND METHOD OF MANUFACTURING SAME

(71) Applicant: JOLED INC., Tokyo (JP)

(72) Inventor: Kenichi Matsuoka, Tokyo (JP)

(73) Assignee: JOLED INC., Tokyo (JP)

(*) Notice: Subject to any disclaimer, the term of this patent is extended or adjusted under 35 U.S.C. 154(b) by 154 days.

(21) Appl. No.: 17/003,991

(22) Filed: Aug. 27, 2020

(65) Prior Publication Data

US 2021/0066670 A1    Mar. 4, 2021

(30) Foreign Application Priority Data

Aug. 30, 2019  (JP) .................. JP2019-157751
Jul. 15, 2020  (JP) .................. JP2020-121649

(51) Int. Cl.
*H01L 51/52*  (2006.01)
*H01L 51/56*  (2006.01)
*H01L 27/32*  (2006.01)

(52) U.S. Cl.
CPC ........ *H01L 51/5284* (2013.01); *H01L 27/322* (2013.01); *H01L 27/3246* (2013.01); *H01L 51/56* (2013.01)

(58) Field of Classification Search
None
See application file for complete search history.

(56) References Cited

U.S. PATENT DOCUMENTS

| 2003/0030766 | A1* | 2/2003 | Kiguchi .................. G02B 5/201 |
| | | | 349/106 |
| 2007/0242192 | A1 | 10/2007 | Shin et al. |
| 2020/0119113 | A1* | 4/2020 | Lee ....................... G06F 3/0446 |
| 2021/0359276 | A1* | 11/2021 | Inari .................... H01L 27/3211 |

FOREIGN PATENT DOCUMENTS

| JP | 2007286591 A | 11/2007 |
| JP | 2009139458 A | 6/2009 |
| WO | 02099477 A1 | 12/2002 |
| WO | 2009072658 A1 | 6/2009 |

* cited by examiner

*Primary Examiner* — Nduka E Ojeh
(74) *Attorney, Agent, or Firm* — Hauptman Ham, LLP

(57) ABSTRACT

Disclosed herein is a display device including a plurality of light emitting portions arranged in a form of a matrix, a sealing layer disposed on the plurality of light emitting portions, a light shielding layer disposed in a gap between the light emitting portions adjacent to each other in a row direction on the sealing layer and extending in a column direction, a transparent partition wall layer disposed on the light shielding layer and extending in the column direction, and a color filter disposed in a gap in the light shielding layer and the transparent partition wall layer on the sealing layer.

18 Claims, 4 Drawing Sheets

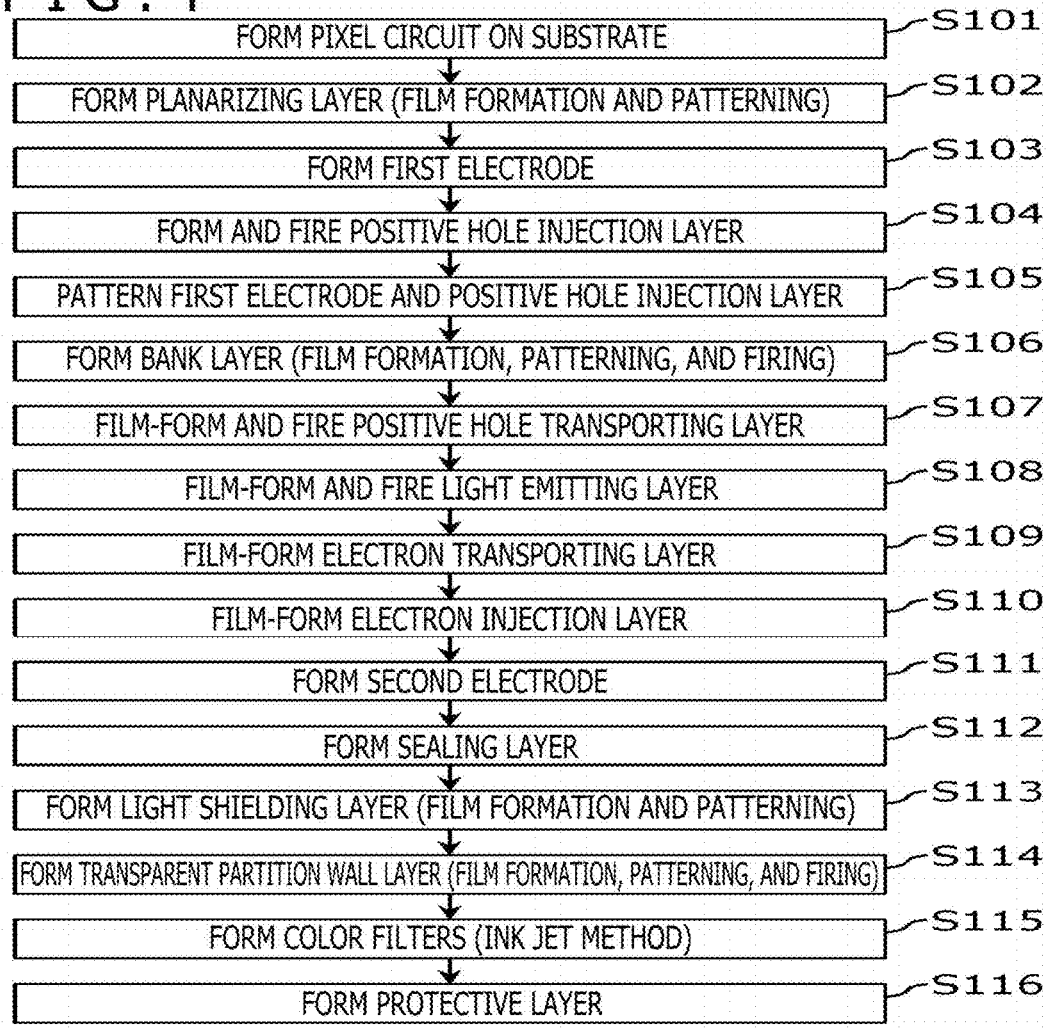
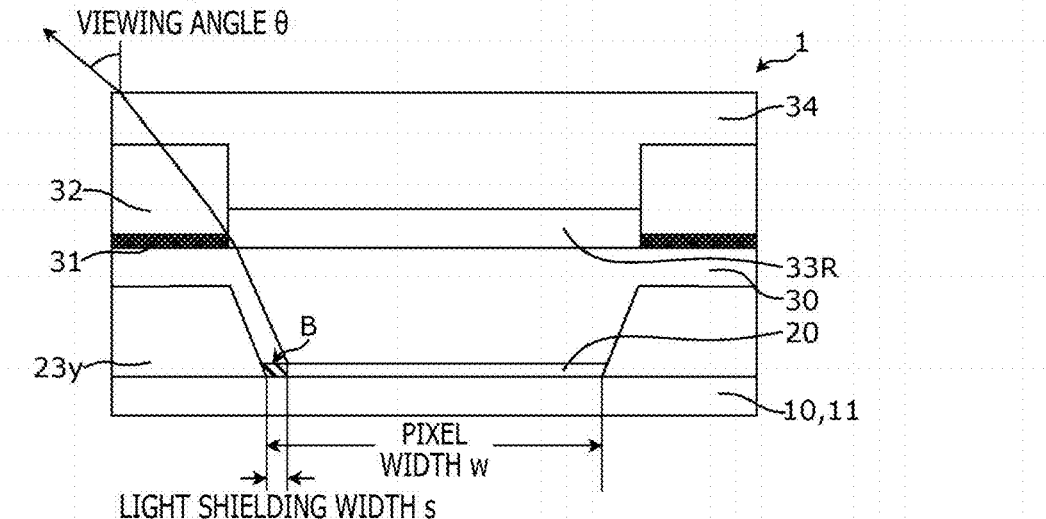

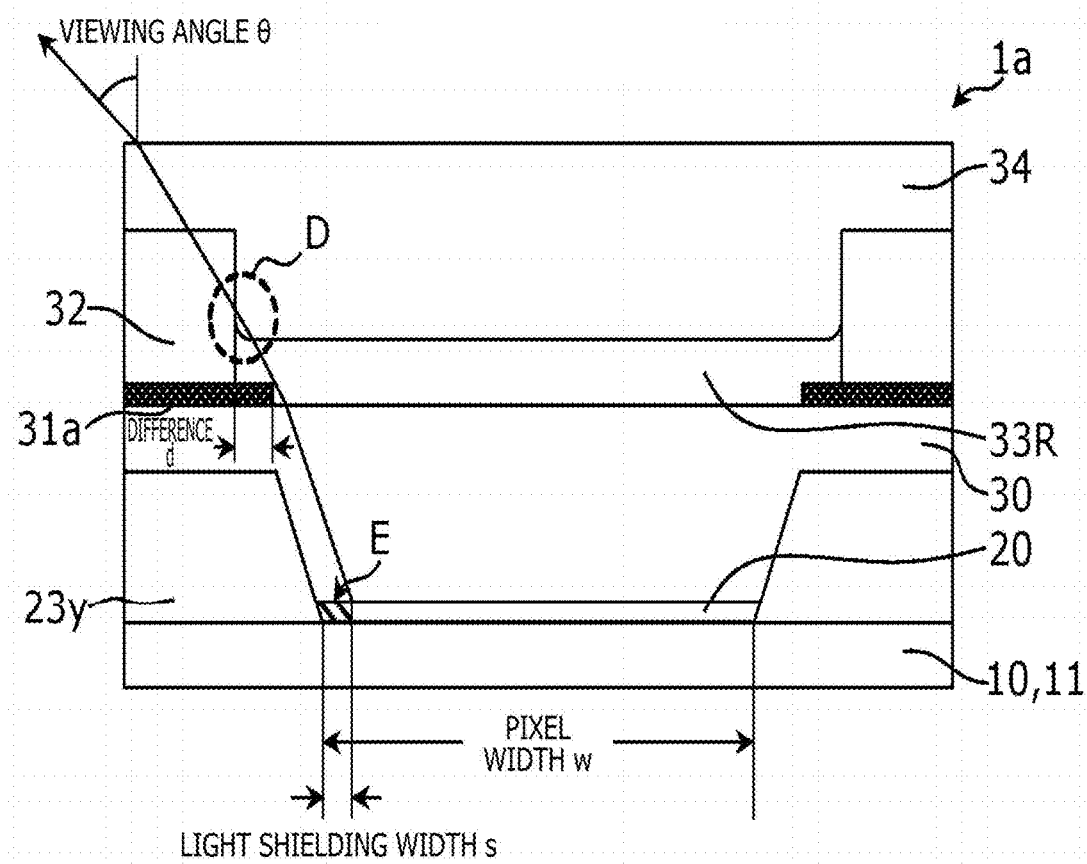

DISPLAY DEVICE INCLUDING TRANSPARENT PARTITION WALL AND METHOD OF MANUFACTURING SAME

RELATED APPLICATIONS

The present application claims priority to Japanese Application Number 2019-157751, filed Aug. 30, 2019 and Japanese Application Number 2020-121649, filed Jul. 15, 2020, the disclosures of which are hereby incorporated by reference herein in their entirety.

BACKGROUND

The present disclosure relates to a display device and a method of manufacturing the same, and particularly to a display device provided with color filters.

There is known a color image display device (hereinafter referred to simply as a display device) in which a plurality of light emitting portions that generate light of different colors (different wavelengths) such as red, green, and blue are periodically arranged on a substrate. An organic electroluminescence (EL) display panel using organic EL elements in light emitting portions is an example of such a display device.

In a display device, a color filter corresponding to a light emission color may be provided on a light emitting side of each light emitting portion in order to obtain desired color characteristics. Japanese Patent Laid-Open No. 2009-139458 (hereinafter referred to as Patent Document 1), for example, discloses (1) fabricating a self-luminous panel device having a photosensitive layer on a light extraction side, (2) forming a black matrix of a colorant on the photosensitive layer by an electrophotographic method using light of light emitting elements of the panel device, and (3) forming color filters by an ink jet method using the black matrix as a bank.

According to the technology of Patent Document 1, the color filters are directly formed on the light emitting portions by the ink jet method. It is therefore possible to enhance usage efficiency of inks, that is, materials of the color filters, and thereby achieve a reduction in cost of the display device.

SUMMARY

However, in the related-art display device in which the color filters are formed by the ink jet method, the black matrix may need to be provided at a sufficient height in order to obtain excellent color characteristics by avoiding mixing of the materials of the color filters corresponding to different light emission colors. However, when the black matrix is provided at a high position, an inconvenience of impairing luminance viewing angle characteristics can occur because emitted light is blocked by the black matrix.

That is, although the related-art display device is excellent in terms of cost reduction, the related-art display device does not necessarily facilitate compatibility between the color characteristics and the luminance viewing angle characteristics.

It is accordingly desirable to provide a display device provided with color filters which display device is excellent in terms of cost reduction and facilitates compatibility between color characteristics and luminance viewing angle characteristics.

According to one mode of the present disclosure, there is provided a display device including a plurality of light emitting portions arranged in a form of a matrix, a sealing layer disposed on the plurality of light emitting portions, a light shielding layer disposed in a gap between the light emitting portions adjacent to each other in a row direction on the sealing layer and extending in a column direction, a transparent partition wall layer disposed on the light shielding layer and extending in the column direction, and a color filter disposed in a gap in the light shielding layer and the transparent partition wall layer on the sealing layer.

Such a configuration is suitable for forming the color filter by the ink jet method in that the color filter is disposed in the gap in the light shielding layer and the transparent partition wall layer on the sealing layer. A reduction in cost can be achieved as in related art by forming the color filter directly on the sealing layer by the ink jet method.

In addition, when the color filter is formed directly on the sealing layer by the ink jet method, mixing of materials of color filters corresponding to different light emission colors can be avoided by using the transparent partition wall layer. Unlike the black matrix, the transparent partition wall layer transmits emitted light. Therefore, the emitted light is not blocked even when the transparent partition wall layer is provided at a high position.

As a result, a display device excellent in reducing manufacturing cost and facilitating compatibility between color characteristics and luminance viewing angle characteristics is obtained.

According to another mode of the present disclosure, there is provided a method of manufacturing a display device, including forming a plurality of light emitting portions in a form of a matrix, forming a sealing layer on the plurality of light emitting portions, forming a light shielding layer extending in a column direction in a gap between the light emitting portions adjacent to each other in a row direction on the sealing layer, forming a transparent partition wall layer extending in the column direction on the light shielding layer, and forming a color filter in a gap in the light shielding layer and the transparent partition wall layer on the sealing layer by an ink jet method.

According to such a method, it is possible to manufacture a display device having the above-described effects.

According to the display device and the method of manufacturing the same in accordance with the modes of the present disclosure, a display device provided with color filters which display device is excellent in reducing manufacturing cost and facilitates compatibility between color characteristics and luminance viewing angle characteristics is obtained.

BRIEF DESCRIPTION OF THE DRAWINGS

FIG. 4 is a process chart illustrating an example of a method of manufacturing the display device according to the embodiment;

FIG. 5 is a diagram schematically illustrating an example of an optical path of emitted light in the display device according to the embodiment;

FIG. 8 is a diagram schematically illustrating an example of a structure of a display device according to a modification and an optical path of emitted light.

DETAILED DESCRIPTION OF THE PREFERRED EMBODIMENTS

Embodiments of the present disclosure will hereinafter be described in detail with reference to the drawings. It is to be noted that the embodiments to be described in the following each represent a comprehensive or concrete example. Numerical values, shapes, materials, constituent elements, arrangement and connection forms of the constituent elements, steps, the order of the steps, and the like represented in the following embodiments are an example, and are not intended to limit the present disclosure.

EMBODIMENTS

A display device according to an embodiment will be described by citing an example of an organic EL display panel provided with a color filter.

Figure 1:
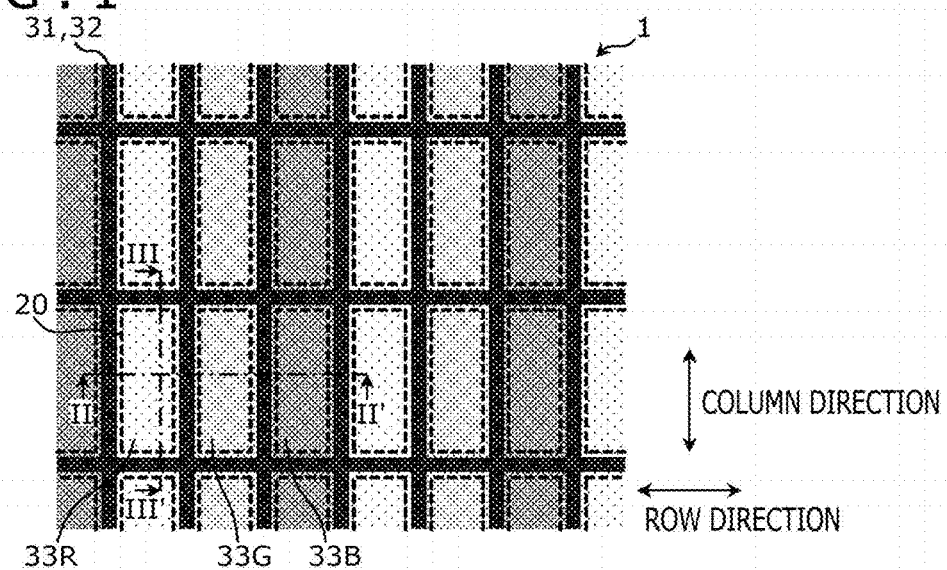
FIG. 1 is a plan view schematically illustrating an example of a configuration of a display device according to an embodiment.

FIG. 1 is a plan view schematically illustrating an example of a configuration of a display device 1 according to an embodiment. In the present specification, for convenience, a horizontal direction in FIG. 1 will be referred to as a row direction, and a vertical direction in FIG. 1 will be referred to as a column direction.

In the display device 1, a plurality of light emitting portions 20 are arranged in the form of a matrix so as to be separated from one another. In the example of FIG. 1, a light emitting portion 20 emitting red light, a light emitting portion 20 emitting green light, and a light emitting portion 20 emitting blue light are periodically arranged so as to be adjacent to one another in the row direction. Light emitting portions 20 arranged in the column direction emit light of a same color.

Figure 2:
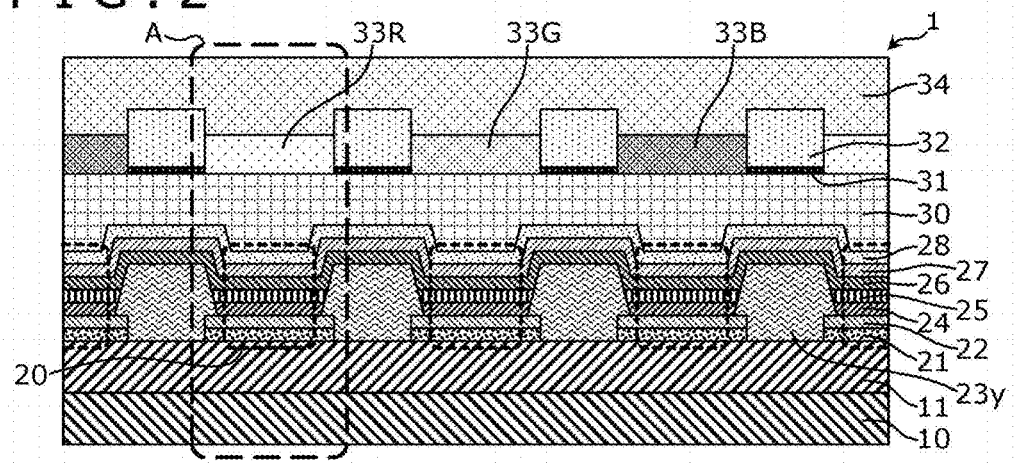
FIG. 2 is a sectional view schematically illustrating the example of the configuration of the display device according to the embodiment.
Figure 3:
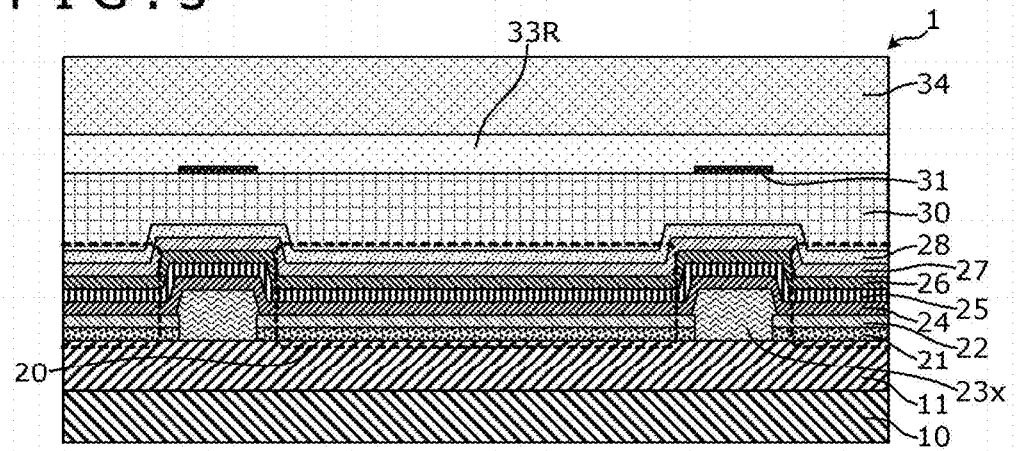
FIG. 3 is a sectional view schematically illustrating the example of the configuration of the display device according to the embodiment.

FIG. 2 and FIG. 3 are sectional views schematically illustrating the example of the configuration of the display device 1 according to the embodiment. FIG. 2 and FIG. 3 respectively correspond to sections in which a line II-II' and a line III-III' illustrated in FIG. 1 are viewed in the directions of arrows.

As illustrated in FIGS. 1 to 3, the display device 1 includes a substrate 10 and a planarizing layer 11 formed on the substrate 10.

A pixel circuit including a thin film transistor, not illustrated, is formed on the substrate 10. The planarizing layer 11 protects the pixel circuit by covering the substrate 10, and forms a flat surface on which an upper structure is disposed.

A first electrode 21, a positive hole injection layer 22, a positive hole transporting layer 24, a light emitting layer 25, an electron transporting layer 26, an electron injection layer 27, and a second electrode 28 are arranged on the planarizing layer 11 in this order. A laminate of these forms a light emitting portion 20. An organic EL light emitting material is used as the light emitting layer 25.

A bank layer 23y extending in the column direction is provided in a gap between the first electrodes 21 of light emitting portions 20 adjacent to each other in the row direction. A bank layer 23x extending in the row direction may be further provided in a gap between the first electrodes 21 of light emitting portions 20 adjacent to each other in the column direction. By partitioning the first electrodes 21 of the light emitting portions 20 adjacent to each other, the bank layer 23y enables each light emitting portion 20 to emit light at an independent luminance.

A sealing layer 30 is provided on the light emitting portions 20 and above the bank layers 23x and 23y. The sealing layer 30 seals the light emitting portions 20.

A light shielding layer 31 extending in the column direction is provided in a gap between the light emitting portions 20 adjacent to each other in the row direction on the sealing layer 30. A light shielding layer 31 extending in the row direction may be further provided in a gap between the light emitting portions 20 adjacent to each other in the column direction. The light shielding layer 31 enhances display contrast by suppressing external light reflection between the light emitting portions 20 adjacent to each other. The light shielding layer 31 corresponds to the black matrix described in the section of the background art. The light shielding layer 31, for example, includes a metal such as chromium or a black resin. When the metal is used, a sufficient light shielding property is obtained easily by a thin film thereof.

A transparent partition wall layer 32 extending in the column direction is provided on the light shielding layer 31. The transparent partition wall layer 32, for example, includes a resin material such as an acrylic-based resin. A photosensitive resin may be used as the transparent partition wall layer 32. In addition, a liquid repelling property for color filter materials may be imparted by adding a fluorine compound.

When a photosensitive resin is used as the transparent partition wall layer 32, a negative type resin may be used. This can suppress an organic layer degradation that can be caused by ultraviolet exposure at the time of formation of the transparent partition wall layer 32.

Color filters 33R, 33G, and 33B are provided in gaps in the light shielding layer 31 and the transparent partition wall layer 32 on the sealing layer 30. The color filters 33R, 33G, and 33B include color filter materials having respective different wavelength selectivities so as to correspond to light emission colors of red, green, and blue, respectively. The color filters 33R, 33G, and 33B realize desired color characteristics by improving chromaticity of emitted light, for example.

The color filters 33R, 33G, and 33B are, for example, formed by arranging the color filter materials in the gaps in the light shielding layer 31 and the transparent partition wall layer 32 by an ink jet method. When a liquid repelling property for the color filter materials is imparted to the transparent partition wall layer 32, color mixing in which the color filter materials move through the transparent partition wall layer 32 and enter an adjacent pixel does not occur easily.

A protective layer 34 is provided on the transparent partition wall layer 32 and the color filters 33R, 33G, and 33B. The protective layer 34, for example, includes an inorganic material such as silicon nitride (SiN) or silicon oxide ($SiO_2$), or a resin material such as a polyimide-based resin, an epoxy-based resin, an acrylic-based resin, or a urethane-based resin.

FIG. 4 is a process chart illustrating an example of a method of manufacturing the display device 1.

As illustrated in FIG. 4, a pixel circuit is formed on the substrate 10 (S101). The planarizing layer 11 is formed on the substrate 10 including the pixel circuit by film formation and patterning (S102).

The first electrode 21 is formed on the planarizing layer 11 (S103). The positive hole injection layer 22 is formed on the first electrode 21, and fired (S104). The first electrode 21 and the positive hole injection layer 22 are patterned, so that a part of the planarizing layer 11 is exposed (S105). The bank layers 23x and 23y are film-formed on the planarizing layer 11 and on the positive hole injection layer 22, are patterned so as to expose a part of the positive hole injection layer 22, and are fired (S106).

The positive hole transporting layer 24 is film-formed and fired in gaps between a plurality of bank layers 23y extending in the column direction (that is, on the positive hole injection layer 22) (S107). The light emitting layer 25 is film-formed and fired on the positive hole transporting layer 24 in the gaps between the plurality of bank layers 23y extending in the column direction (S108). The electron transporting layer 26 is film-formed on the light emitting layer 25 and on the bank layer 23y (S109). The electron injection layer 27 is film-formed on the electron transporting layer 26 (S110). The second electrode 28 is formed on the electron injection layer 27 (S111). The sealing layer 30 is formed on the second electrode 28 (S112).

The light shielding layer 31 is formed in gaps between light emitting portions 20 adjacent to each other on the sealing layer 30 by film formation and patterning (S113). The transparent partition wall layer 32 is formed on the light shielding layer 31 by film formation, patterning, and firing (S114).

The color filters 33R, 33G, and 33B are formed in gaps in the light shielding layer 31 and the transparent partition wall layer 32 on the sealing layer 30 by the ink jet method (S115). The protective layer 34 is formed on the transparent partition wall layer 32 and on the color filters 33R, 33G, and 33B (S116).

The display device 1 described above is suitable for forming color filters by the ink jet method in that the color filters 33R, 33G, and 33B are provided in the gaps in the light shielding layer 31 and the transparent partition wall layer 32 on the sealing layer 30. The display device 1 in which the color filters 33R, 33G, and 33B are directly formed on the sealing layer 30 by the ink jet method is superior in the following respects to a display device of a structure obtained by fabricating a first substrate including light emitting portions and a second substrate including color filters as separate parts, and then laminating the first substrate and the second substrate to each other.

The display device 1 is superior in terms of cost reduction in that usage efficiency of inks, that is, the materials of the color filters is enhanced.

The display device 1 is superior in terms of application to a flexible sheet panel. The display device of the laminated structure may not have desired flexibility and desired stress resistance, and is thus difficult to apply to the flexible sheet panel.

The display device 1 is superior in terms of luminance viewing angle characteristics in that the color filters can be directly formed over the light emitting portions. The display device of the laminated structure tends to be disadvantageous from a viewpoint of luminance viewing angle characteristics because a bonding layer for lamination increases a distance between the light emitting portions and the color filters.

In addition, in the display device 1, the color filters 33R, 33G, and 33B corresponding to different light emission colors are arranged in the gaps in the light shielding layer 31 and the transparent partition wall layer 32. Thus, even when the light shielding layer 31 is not provided at a high position, mixing of the materials of the color filters 33R, 33G, and 33B can be avoided by using the transparent partition wall layer 32. Unlike the light shielding layer 31, the transparent partition wall layer 32 transmits emitted light. Therefore, the emitted light is not blocked even when the transparent partition wall layer 32 is provided at a high position.

As a result, the display device 1 excellent in reducing manufacturing cost and facilitating compatibility between color characteristics and luminance viewing angle characteristics is obtained.

Of the above-described effects, an improvement in luminance viewing angle characteristics resulting from the use of the transparent partition wall layer 32, in particular, will be described concretely while compared with a comparative example.

FIG. 5 is a diagram schematically illustrating an example of an optical path of emitted light in the display device 1 according to the embodiment. In FIG. 5, a part corresponding to a portion A in FIG. 2 is illustrated in enlarged dimension as an example. Constituent elements illustrated in FIG. 5 are the same as the constituent elements referred to by the same reference symbols in FIG. 2, and therefore description thereof will be omitted.

FIG. 5 illustrates an optical path of light not blocked by the light shielding layer 31 as viewed at a viewing angle θ and emitted from a position closest to one end of the light emitting portion 20 (left end in FIG. 5), the light being a part of light emitted from the light emitting portion 20. Here, the viewing angle θ refers to an angle when a front direction of the display device 1 is set as 0°.

As viewed at the viewing angle θ, light emitted from an invisible region B of the light emitting portion 20 is blocked by the light shielding layer 31. Incidentally, an optical path of emitted light at another end of the light emitting portion 20 (right end in FIG. 5) is explained similarly on the basis of the bilaterally symmetric shape of FIG. 5.

A width of the invisible region B emitting light blocked by the light shielding layer 31 will be described as a light shielding width s, and a width of the light emitting portion 20 will be described as a pixel width w. A ratio of the light shielding width s to the pixel width w will be defined as a light shielding ratio r. That is, the light shielding ratio r is expressed as a percentage, and is Light Shielding Width s/Pixel Width w×100. The light shielding width s and the light shielding ratio r depend on the viewing angle θ.

Figure 6:
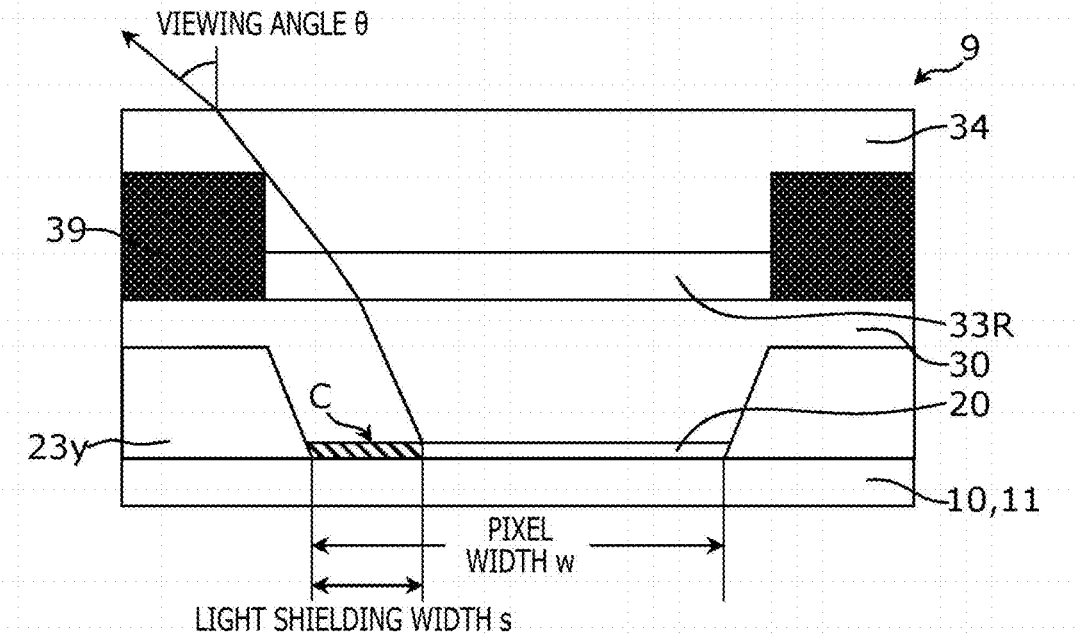
FIG. 6 is a diagram schematically illustrating an example of an optical path of emitted light in a display device according to a comparative example.

FIG. 6 is a diagram schematically illustrating an example of an optical path of emitted light in a display device 9 according to a comparative example. The display device 9 in FIG. 6 is different from the display device 1 in FIG. 5 in that a tall light shielding layer 39 is used in place of the light shielding layer 31 and the transparent partition wall layer 32. The color filters 33R, 33G, and 33B in the display device 9 are formed in gaps in the light shielding layer 39 by the ink jet method.

In the display device 9, the light shielding layer 39 is tall, and therefore a larger invisible region C than the invisible region B in the display device 1 occurs at the same viewing angle θ. That is, at the same viewing angle θ, as compared with the display device 1, the light shielding width s is larger, and consequently the light shielding ratio r is larger.

Figure 7:
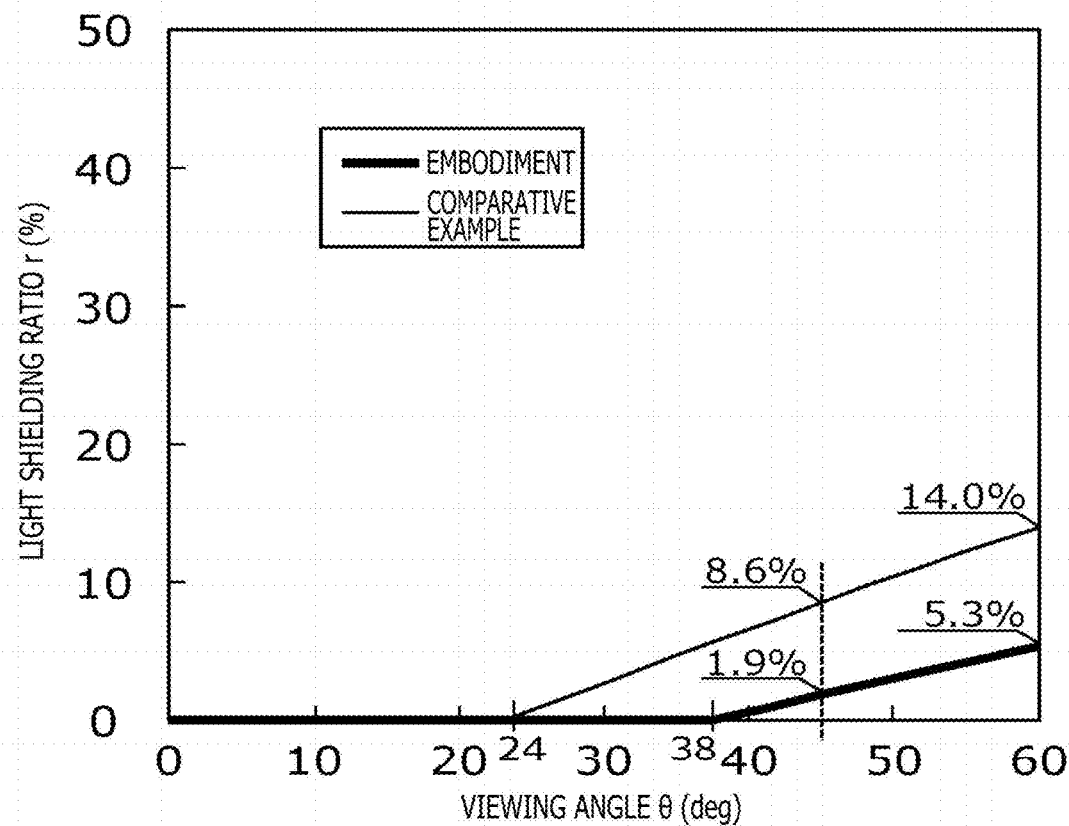
FIG. 7 is a graph illustrating a light shielding ratio of the display device according to the embodiment in comparison with the comparative example.

FIG. 7 is a graph illustrating the light shielding ratio r of the display device 1 as an embodiment and the light shielding ratio r of the display device 9 as a comparative example in comparison with each other. The light shielding ratios r illustrated in FIG. 7 were obtained by calculation for pixels corresponding to red light after the following dimensional conditions were applied to both of the display devices 1 and 9.

The pixel width w was set at 33 µm, and a wavelength of red light was set at 620 nm. A width of the light shielding layer 31 was set at 8 µm, and a width of the bank layer 23$y$ was set at 14 µm. A thickness of the color filter 33R (that is, a film thickness) was set at 2 µm.

In the display device 1, a thickness of the light shielding layer 31 was set at 0.1 µm, and a thickness of the transparent partition wall layer 32 was set at 4 µm. In the display device 9, a thickness of the light shielding layer 39 was set at 4 µm. In the calculation, light applied to upper end portions of the light shielding layers 31 and 39 was assumed to be lost completely. In actuality, however, a distribution in which absorption is reduced toward the end portions occurs in the vicinities of the end portions.

A SiN film having a thickness of 5 µm was used as the protective layer 34. Used as the sealing layer 30 was a laminated film including a SiN film having a thickness of 1 µm, a resin film having a thickness of 5 µm, and a SiN film having a thickness of 1 µm in this order.

As seen in FIG. 7, in the display device 1 according to the embodiment, the invisible region B occurred at a viewing angle θ of 38°, and the light shielding ratio r at viewing angles θ of 45° and 60° was 1.9% and 5.3%, respectively.

In contrast, in the display device 9 according to the comparative example, the invisible region C occurred at a viewing angle θ of 24°, and the light shielding ratio r at viewing angles θ of 45° and 60° was 8.6% and 14.0%, respectively.

The above-described result confirms that the display device 1 in which the thickness of the light shielding layer 31 is reduced improves luminance viewing angle characteristics as compared with the display device 9. Incidentally, while the above-described result is obtained for pixels corresponding to red light, it has been confirmed that similar results are obtained also for pixels corresponding to green light and pixels corresponding to blue light.

In the example of the display device 1, the light shielding layer 31 and the transparent partition wall layer 32 are provided with the same width, but are not limited to the present example. For example, the transparent partition wall layer 32 may be provided with a smaller width than the light shielding layer 31.

FIG. 8 is a diagram schematically illustrating an example of a structure of a display device 1$a$ according to a modification and an optical path of emitted light. The display device 1$a$ illustrated in FIG. 8 is different from the display device 1 in FIG. 5 in that the transparent partition wall layer 32 is provided with a smaller width than a light shielding layer 31$a$.

In an actual color filter 33R formed by the ink jet method, a thickness at an end portion of a gap in the transparent partition wall layer 32 (that is, in the vicinity of the transparent partition wall layer 32) tends to become larger than a thickness at a center of the gap in the transparent partition wall layer 32 (that is, a pixel central portion) in a drying process (portion D in FIG. 8). When the thickness of the color filter 33R differs within the pixel, chromaticity of the emitted light after passing through the color filter 33R also changes within the pixel, and forms a distribution.

Accordingly, the above-described effect is reduced or suppressed by providing a difference d between the width of the light shielding layer 31$a$ and the width of the transparent partition wall layer 32, and thus providing the transparent partition wall layer 32 having a smaller width than the light shielding layer 31$a$. Specifically, the difference d between the width of the light shielding layer 31$a$ and the width of the transparent partition wall layer 32 may be selected from a range of 1 to 2 µm both inclusive.

Because the transparent partition wall layer 32 is provided so as to have a smaller width than the light shielding layer 31$a$ in the display device 1$a$, an invisible region E of the display device 1$a$ is suppressed to the same extent as the invisible region B of the display device 1.

That is, in addition to the effects of the display device 1, the display device 1$a$ can provide better color characteristics, specifically chromaticity of high uniformity within a pixel surface.

A display device according to an embodiment of the present disclosure has been described above by citing an example of an organic EL display panel. However, the present disclosure is not limited to individual embodiments. Forms in which various kinds of modifications occurring to those skilled in the art are applied to the present embodiments and forms constructed by combining constituent elements in different embodiments with each other may be included in the scope of one or a plurality of modes of the present disclosure unless departing from the spirit of the present disclosure.

For example, while the thickness of the light shielding layer 31 is set at 0.1 µm in the example of the embodiment, the thickness can be set at 0.1 to 0.5 µm both inclusive in a case where the light shielding layer 31 is a metal such as chromium, and the thickness can be set at 0.5 to 2 µm both inclusive in a case where the light shielding layer 31 is a black resin.

In addition, while the thickness of the transparent partition wall layer 32 is set at 4 µm in the example of the embodiment, the thickness of the transparent partition wall layer 32 can be set at 1 to 5 µm both inclusive.

In addition, while the light emitting portions 20 generate light of the corresponding colors in the example of the embodiment, there is no limitation to the present example. For example, the light emitting portions 20 may generate white light, and the color filters 33R, 33G, and 33B may transmit light of desired chromaticities such as red, green, and blue from the white light generated by the light emitting portions 20.

The color filters 33R, 33G, and 33B may include quantum dots. In this case, the light generated by the light emitting portions 20 may be light of any wavelength as long as the color filters 33R, 33G, and 33B convert the light generated by the light emitting portions 20 into light of desired chromaticities. In addition, the light emitting portions 20 themselves may include quantum dots.

The present disclosure can be widely used as a display device in various video display devices such as a portable information terminal, a personal computer, and a television receiver.

This application claims the benefit of Japanese Priority Patent Applications JP 2019-157751 filed Aug. 30, 2019 and JP 2020-121649 filed Jul. 15, 2020, the entire contents of which are incorporated herein by reference.

What is claimed is:
1. A display device comprising:
a plurality of light emitting portions arranged in a form of a matrix;
a sealing layer disposed on the plurality of light emitting portions;

a light shielding layer disposed in a gap between the light emitting portions adjacent to each other in a row direction on the sealing layer, and extending in a column direction;

a transparent partition wall layer disposed on the light shielding layer and extending in the column direction; and a color filter disposed in a gap in the light shielding layer and the transparent partition wall layer on the sealing layer.

2. The display device according to claim 1, further comprising:

a second light shielding layer disposed in a gap between the light emitting portions adjacent to each other in the column direction on the sealing layer, and extending in the row direction.

3. The display device according to claim 1, wherein the transparent partition wall layer has a liquid repelling property.

4. The display device according to claim 1, wherein a thickness of the light shielding layer is 0.1 to 2 μm both inclusive.

5. The display device according to claim 1, wherein a thickness of the transparent partition wall layer is 1 to 5 μm both inclusive.

6. The display device according to claim 1, wherein a width of the transparent partition wall layer is smaller than a width of the light shielding layer.

7. The display device according to claim 6, wherein a difference between the width of the transparent portion wall layer and the width of the light shielding layer ranges from 1 μm to 2 μm both inclusive.

8. The display device according to claim 1, wherein each of the plurality of light emitting portions includes a first electrode, a light emitting layer including an organic material disposed above the first electrode, and a second electrode disposed above the light emitting layer, and a bank layer extending in the column direction is disposed in a gap between the first electrodes of the light emitting portions adjacent to each other in the row direction.

9. The display device according to claim 1, wherein a first thickness of the color filter at an interface with the transparent partition wall layer is greater than a second thickness of the color filter in a central region of the color filter.

10. A method of manufacturing a display device, the method comprising:

forming a plurality of light emitting portions in a form of a matrix;

forming a sealing layer on the plurality of light emitting portions;

forming a light shielding layer extending in a column direction in a gap between the light emitting portions adjacent to each other in a row direction on the sealing layer;

forming a transparent partition wall layer extending in the column direction on the light shielding layer; and forming a color filter in a gap in the light shielding layer and the transparent partition wall layer on the sealing layer by an ink jet method.

11. The method according to claim 10, further comprising:

forming a second light shielding layer disposed in a gap between the light emitting portions adjacent to each other in the column direction on the sealing layer, and extending in the row direction.

12. The method according to claim 10, wherein forming the transparent partition wall layer comprises forming the transparent partition wall layer having a liquid repelling property.

13. The method according to claim 10, wherein forming the light shielding layer comprise forming the light shielding layer having a thickness ranging from 0.1 to 2 μm both inclusive.

14. The method according to claim 10, wherein forming the transparent partition wall layer comprise forming the transparent partition wall layer having a thickness ranging from 1 to 5 μm both inclusive.

15. The method according to claim 10, wherein forming the transparent partition wall layer comprises forming the transparent partition wall layer having a width smaller than a width of the light shielding layer.

16. The method according to claim 15, wherein forming the transparent partition wall layer comprise forming a difference between the width of the transparent partition wall layer and the width of the light shielding layer ranging from 1 μm to 2 μm both inclusive.

17. The method according to claim 10, wherein forming each of the plurality of light emitting portions comprises:

forming a first electrode, a light emitting layer including an organic material disposed above the first electrode, and a second electrode disposed above the light emitting layer, and forming a bank layer extending in the column direction is in a gap between the first electrodes of the light emitting portions adjacent to each other in the row direction.

18. The method according to claim 10, wherein forming the color filter comprises forming the color filter having a first thickness at an interface with the transparent partition wall layer being greater than a second thickness of the color filter in a central region of the color filter.

* * * * *